(12) United States Patent
Gicquel et al.

(10) Patent No.: US 8,648,642 B2
(45) Date of Patent: Feb. 11, 2014

(54) LOW VOLTAGE ANALOG SWITCH

(75) Inventors: Hugo Gicquel, Grenoble (FR); Beatrice Lafiandra, Sassenage (FR); Christophe Forel, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 14 days.

(21) Appl. No.: 13/587,071

(22) Filed: Aug. 16, 2012

(65) Prior Publication Data

US 2013/0043938 A1    Feb. 21, 2013

(30) Foreign Application Priority Data

Aug. 19, 2011  (FR) ...................................... 11 02545

(51) Int. Cl.
*H03K 17/16*    (2006.01)
*H03K 17/687*    (2006.01)

(52) U.S. Cl.
USPC ............ 327/389; 327/391; 327/427; 327/437

(58) Field of Classification Search
None
See application file for complete search history.

(56) References Cited

U.S. PATENT DOCUMENTS

| | | | | |
|---|---|---|---|---|
| 5,561,389 A | * | 10/1996 | Duley | 327/143 |
| 5,617,057 A | * | 4/1997 | Rees et al. | 327/543 |
| 5,644,266 A | * | 7/1997 | Chen et al. | 327/534 |
| 5,789,964 A | * | 8/1998 | Voldman | 327/380 |
| 6,355,654 B1 | * | 3/2002 | Giardina et al. | 514/312 |
| 6,433,613 B1 | * | 8/2002 | Goodell et al. | 327/427 |
| 7,894,170 B2 | * | 2/2011 | Liao et al. | 361/56 |
| 2007/0235754 A1 | | 10/2007 | Yamamoto | |
| 2008/0018368 A1 | * | 1/2008 | Wadhwa et al. | 327/143 |
| 2010/0123509 A1 | * | 5/2010 | Lin et al. | 327/436 |

FOREIGN PATENT DOCUMENTS

WO    2008065771 A1    6/2008

OTHER PUBLICATIONS

Abo et al., "A 1.5V, 10-bit, 14MS/s CMOS Pipeline Analog-to-Digital Converter," IEEE Journal of Solid-State Circuits, vol. 34, No. 5, May 1999, 4 pages.
Sekimoto et al., "A Power Scalable SAR-ADC in 0.18μm-CMOS with a 0.5V Nano-Watt Operation," 2011 1st International Symposium on Access Spaces, Jun. 17, 2011, pp. 89-94.

* cited by examiner

*Primary Examiner* — Tuan T Lam
(74) *Attorney, Agent, or Firm* — Allen, Dyer, Doppelt, Milbrath & Gilchrist, P.A.

(57) ABSTRACT

A switch for an analog signal may include a main MOS transistor whose source forms an input terminal of the switch and whose drain forms an output terminal of the switch, a capacitor having a first terminal permanently connected to the source of the main transistor, a circuit for charging the capacitor, and a first auxiliary transistor configured to connect the second terminal of the capacitor to the gate of the main transistor in response to a control signal. The charge circuit may include a resistor permanently connecting the second terminal of the capacitor to a power supply line. The capacitor and the resistor may form a high-pass filter having a cutoff frequency lower than the frequency of the analog signal.

17 Claims, 2 Drawing Sheets

LOW VOLTAGE ANALOG SWITCH

FIELD OF THE INVENTION

The invention relates to a switch for analog signals, and, in particular, a switch used in a sample-and-hold circuit of an analog-to-digital converter.

BACKGROUND OF THE INVENTION

An analog signal switch is generally formed by a metal oxide semiconductor (MOS) transistor, the source forming the input terminal and the drain forming the output terminal. To close the switch, i.e. render the transistor conductive, a gate-source voltage Vgs exceeding the threshold voltage Vt of the transistor is normally applied. In addition, to obtain the lowest possible resistance when the transistor is in the conductive state, it is sought to apply the highest possible constant gate-source voltage within the limits of the transistor manufacturing technology. As the source voltage is variable, the "bootstrap" technique is used, which comprises precharging a capacitor to the highest possible voltage, and applying the voltage of this capacitor between the gate and source of the transistor to render it conductive.

FIG. 1 shows an example of the "bootstrap" technique for the control of the power stage of a DC-DC or DC-AC converter. For example, the L6385 circuit uses this structure, as available from STMicroelectronics, N.V. of Geneva, Switzerland. The power stage comprises two N-channel MOS transistors, MNH and MNL, connected in series between the power supply lines Vdd and Vss. Their interconnection point provides the output V1 of the stage. These transistors are controlled in phase opposition so as to alternately bring the output V1 between the potentials Vdd and Vss with a desired duty factor.

For the high-side transistor MNH to be able to bring the terminal V1 to the potential Vdd, and have a low impedance, it may have a gate potential higher than Vdd. For that, a capacitor Cb is provided, having a low-side terminal connected to the source of the transistor MNH and a high-side terminal connected to the line Vdd by a diode D. The gate of the transistor MNH is controlled by a circuit 10 powered from the capacitor Cb.

The diode D is connected to be conductive when the output V1 is pulled toward the line Vss by the transistor MNH. The capacitor Cb thus charges to a voltage Vdd−Vt, where Vt is the threshold voltage of the diode D. When the output V1 is pulled toward the line Vdd, the potential on the high terminal of the capacitor Cb increases with the potential of the terminal V1, whereby the diode D is reverse biased and the capacitor Cb keeps its charge. Thus, the circuit 10 may control the transistor MNH with a voltage Vgs=Vdd−Vt, whatever the potential V1 on the transistor source.

This "bootstrap" structure, although simple and efficient, cannot be used in low voltage applications, because the threshold Vt of the diode D, around 0.6 V, is too high with respect to the power supply voltage Vdd, for example, 1.2 V, used in these applications. The result is that the voltage reached across the capacitor Cb is insufficient to control the switching transistor.

Analog-to-digital converters, generally integrated with the digital circuits they drive, are made with the densest technologies. In these technologies, the transistors are particularly sensitive to fatigue or "stress" phenomena, due to excess of the nominal operating voltage. These phenomena tend to deteriorate the gate oxides of the transistors, rendering them conductive little by little. Two types of transistors, which can be made on a same integrated circuit, are then provided: the transistors having single gate oxide thickness, called GO1, and the transistors having double gate oxide thickness, called GO2. For the technological nodes of 90, 65 and 40 nm, the nominal voltages of the transistors GO1 and GO2 are around 1.2 V and 2.5 V, respectively. GO1 transistors have better characteristics, in particular, as to their on-resistance (Ron) and cutoff frequency. Thus, GO2 transistors are only used as a last resort.

FIG. 2 shows a typical principle allowing the "bootstrap" technique to be used in low voltage applications. The terminals of the capacitor Cb are connected by respective switches S1 and S2 to the power supply lines Vdd and Vss. Switches S3 and S4 connect the terminals of the capacitor Cb respectively to the gate and source of the switching transistor MN1, of N-channel MOS type. The source of the transistor MN1 forms the input terminal V1 of the analog signal to be switched, and the drain forms the output terminal V2 of the switch. A switch S5 connects the gate of the transistor MN1 to the line Vss. The substrate of transistor MN1 is connected to the line Vss, the lowest available potential, so as to reduce the threshold voltage Vt of the transistor.

To control the opening of transistor MN1, switches S1, S2 and S5 are closed, and switches S3 and S4 are opened. The capacitor Cb is charged at the voltage Vdd, provided that switches S1 and S2 have a low voltage drop. The gate of transistor MN1 is connected to the line Vss, normally at a potential lower than V1, that of the transistor source. This inversion of voltage Vgs of transistor MN1 is desirable to minimize leakage current and guarantee that the voltage Vgs remains low enough for the minimum values of the input signal applied to the terminal V1.

To control the closing of transistor MN1, switches S1, S2 and S5 are opened, and switches S3 and S4 are closed, as shown. The capacitor Cb is connected between the gate and source of transistor MN1 and applies a voltage Vgs=Vdd. To have sufficient dynamics for an analog-to-digital conversion, the analog signal to be switched V1 has a peak-to-peak deviation around 1 V, and its common mode is around 1.2 V. The result is that, taking into account the usual margins of tolerance, the voltage V1 may reach 1.8 V, and therefore exceed the nominal power supply voltage of GO1 transistors. The structure of FIG. 2 is therefore built with GO2 transistors and powered under Vdd=2.5 V.

FIG. 3 is a detailed diagram of a switching circuit implementing the principle of FIG. 2, as described by the article "A 1.5V, 10-bit, 14.3-MS/s CMOS Pipeline Analog-to-Digital Converter," Andrew M. Abo and Paul R. Gray, IEEE JOURNAL OF SOLID-STATE CIRCUITS, VOL. 34, NO. 5, MAY 1999. In this circuit, the elements of FIG. 2 have been identified.

This circuit will not be described in detail, but the complexity thereof can be noted. This complexity mainly results from the fact that the maximum voltage reached in the circuit, by the high-side terminal of the capacitor Cb, is around 4.3 V (1.8 V for the voltage V1 plus 2.5 V for the voltage across the capacitor Cb). This voltage exceeds the nominal voltage of GO2 transistors, and various precautions are taken to "protect" the stressed transistors. For example, the switch S5 is formed by two cascoded transistors. The gate of the P-channel MOS transistor forming the switch S3 cannot be connected to the line Vss to render this transistor conductive—for that, a three-transistor circuit has been provided to connect this gate to the low-side terminal of the capacitor Cb.

In addition, the switch S1 is formed by an N-channel MOS transistor requiring a gate potential higher than the potential Vdd so that the high terminal of the capacitor Cb may be brought to Vdd. A charge pump is provided to that end, shown at the left of the transistor S1. The reason why an N-channel transistor has been chosen for the switch S1 is that a P-channel transistor would have, at the level of its substrate-drain junction, a forward biased diode between the high-side terminal of the capacitor Cb and the line Vdd, limiting the potential of this terminal to Vdd+Vt. The switching transistor MN1 has a dual gate oxide thickness, and its characteristics in terms of on-resistance are not optimum.

SUMMARY OF THE INVENTION

An object is to provide a low-voltage analog switch having both a simple structure and optimal characteristics.

A switch for an analog signal may comprise a main MOS transistor whose source forms an input terminal of the switch and whose drain forms an output terminal of the switch, a capacitor having a first terminal permanently connected to the source of the main transistor, a circuit for charging the capacitor, and a first auxiliary transistor configured to connect the second terminal of the capacitor to the gate of the main transistor in response to a control signal. The charging circuit may comprise a resistor permanently connecting the second terminal of the capacitor to a power supply line, the capacitor and the resistor forming a high-pass filter having a cutoff frequency lower than the frequency of the analog signal.

According to an embodiment, the main transistor may have a single gate oxide thickness, and the first auxiliary transistor may have a double gate oxide thickness. The power supply line may receive a voltage whose nominal value is compatible with transistors having a double gate oxide thickness, and the common mode voltage of the analog signal may be near a nominal value compatible with transistors having a single gate oxide thickness.

Additionally, the switch may comprise a second auxiliary transistor having a double gate oxide thickness configured to connect the gate of the main transistor to a power supply reference line in phase opposition with the control signal. The two auxiliary transistors may be complementary MOS transistors forming an inverter powered between the power supply reference line and the second terminal of the capacitor.

In another embodiment, the capacitor may comprise a MOS transistor of same nature as the main transistor. The substrates of the main transistor and the transistor forming the capacitor may be connected to a same power supply reference line. The resistor may comprise a series regulator connected to regulate the voltage on the second terminal of the capacitor from the power supply line, the regulator having a response limited in frequency, so that it imposes an average voltage on the second terminal of the capacitor, and behaves like a resistor at the frequency of the analog signal.

BRIEF DESCRIPTION OF THE DRAWINGS

Embodiments of the invention will be described in the following description, in relation with, but not limited to the appended figures wherein.

DETAILED DESCRIPTION OF THE PREFERRED EMBODIMENTS

In order to improve the characteristics, in particular, the on-resistance Ron, of a low voltage analog switch, it has been sought to use a main transistor having a single gate oxide thickness in a circuit also including auxiliary transistors with a double gate oxide thickness. To be able to combine these elements, it is taken advantage of the fact that the analog signal is normally an alternating signal and that its common mode is at around half the nominal voltage supported by the transistors with double gate oxide thickness.

Figure 1:
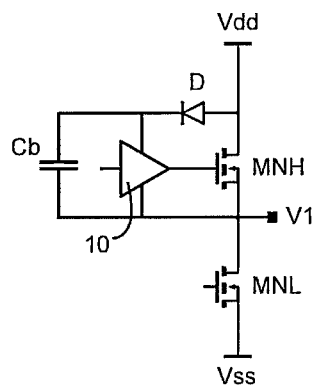
FIG. 1 shows a power stage control circuit using the "bootstrap" technique, according to the prior art.
Figure 2:
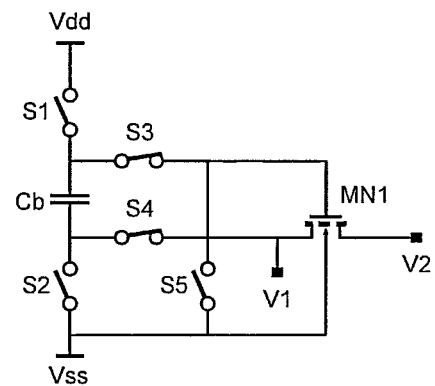
FIG. 2 shows an application principle of the "bootstrap" technique to a low voltage analog switch, according to the prior art.
Figure 4:
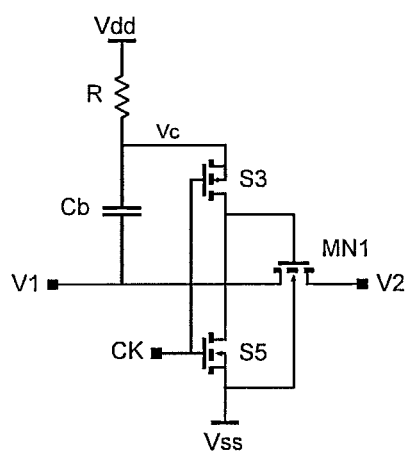
FIG. 4 is a schematic diagram of an embodiment of analog switch, according to the present invention.

FIG. 4 shows an embodiment of switch resulting from this disclosure. Some of the elements of FIG. 2 are mentioned with the same reference numerals. The power supply voltage Vdd is the nominal voltage of the transistors with double oxide thickness, while the main switching transistor MN1 has a single oxide thickness.

The switches S1, S2 and S4 are no longer needed. The low terminal of the capacitor Cb is permanently connected, i.e. without an intermediate switch (S4), to the source of transistor MN1, which forms the input terminal V1 of the analog signal. The high-side terminal of the capacitor Cb is connected to the line Vdd by a resistor R, which replaces the switch S1. Thus, a high-pass filter is formed between the terminal V1 and the high-side terminal Vc, of the capacitor Cb. The voltage Vc follows the rapid evolutions of the input voltage V1, whereas the voltage $V_{cb}$ across the capacitor Cb establishes at Vdd−Vcm, where Vcm is the common mode value of the input voltage V1, i.e. the DC component of the voltage V1. So that the voltage Vc follows the variations of the voltage V1 without significant reduction, the cutoff frequency of the filter is preferably lower than the minimum frequency of the signal V1. For a technological node of 65 nm, Vcm=1.25 V, for example, the voltage Vdd being of 2.5 V, the voltage $V_{cb}$ across the capacitor Cb also establishes at 1.25 V, which remains compatible with the transistors having a single oxide thickness.

Figure 3:
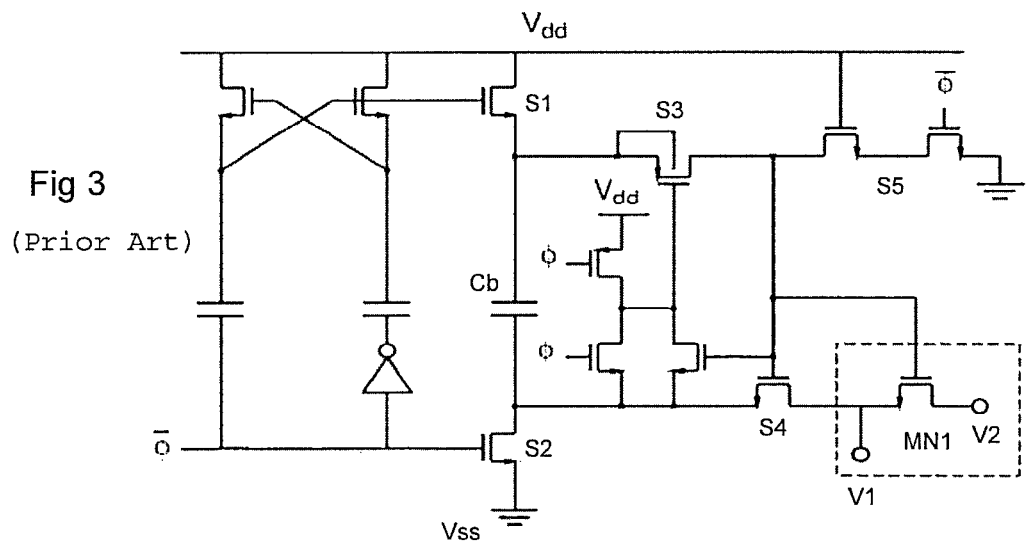
FIG. 3 is a detailed circuit diagram of a switch implementing the principle of FIG. 2, according to the prior art.

The switch S3 is formed by a P-channel MOS transistor, as in the circuit of FIG. 3, with dual oxide thickness. The switch S5 is formed by a single N-channel MOS transistor, with dual oxide thickness. The gates of transistors S3 and S5 are controlled by a same switching signal, or sampling signal CK, which varies between Vss (or 0) and Vdd. The transistors S3 and S5 thus form an inverter powered between Vc and Vss, whose input receives the signal CK, and whose output controls the gate of transistor MN1.

When the signal CK is at 0, the transistor S5 is blocked and the transistor S3 is conductive. The transistor S3 connects the capacitor Cb between the gate and source of transistor MN1. The transistor MN1 sees a gate-source voltage Vgs around 1.25 V, corresponding to the maximum value compatible with the single thickness oxide type. The transistor MN1 becomes conductive with the minimum resistance obtainable in the technology.

In addition, the source-gate voltage of transistor S3 reaches a maximum value of $Vc_{max} = V1_{max} V_{Cb} 1.8 + 1.25 = 3.05$ V, only during maximum peaks of the signal V1. This is a value higher than the nominal value of 2.5 V, but which remains within the margins of tolerance, in particular, because transistor S3 is a P-channel transistor and accepts more significant excesses than N-channel transistors. Values up to 3.1 V are acceptable for P-channel transistors. In the configuration of FIG. 3, a source-gate voltage of 4.3 V would have been reached, which would have no longer been acceptable.

The blocked N-channel transistor S5, sees a maximum drain-source voltage of 3.05 V, but the fatigue phenomenon is limited in these conditions, because the fatigue occurring between the drain and the source mainly depends on "hot carriers" in the channel, which are absent here because the transistor is blocked. The risk of oxide breakdown is low since, the channel not being formed, the breakdown fatigue occurs on a lateral part of the oxide only.

When the signal CK goes to Vdd, the transistor S5 becomes conductive and transistor S3 blocks. The transistor S5 connects the gate of transistor MN1 to 0 (Vss), causing it to block. The transistor S3 disconnects the capacitor Cb from the gate of transistor MN1.

The source voltage Vc of transistor S3 goes on varying according to the variation of the voltage V1, whereas the gate is fixed at Vdd by the command CK. Thus, the source-gate voltage of transistor S3, equal to Vc−Vdd, may reach 3.05−2.5=0.55 V. This value remains lower than the on threshold of transistor S3, so that transistor S3 does not turn on at an untimely moment during maximum peaks of the signal V1. Even if it was on, its conduction would be low and largely compensated by transistor S5.

Figure 5:
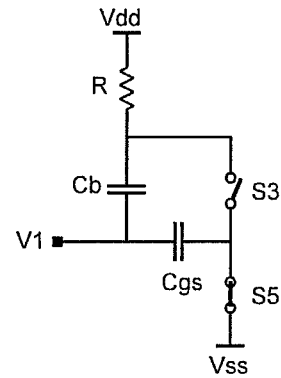
FIG. 5 is an equivalent diagram of some elements of the circuit of FIG. 4.

FIG. 5 is an equivalent diagram of some elements of FIG. 4, intended to show a parasitic effect which may occur in the embodiment of FIG. 4. The source and the gate of transistor MN1 have been replaced by the gate-source capacitance Cgs of this transistor. The switches S3 and S5 are schematically shown.

One of the terminals of the capacitance Cds is connected to the terminal V1, and the other terminal is alternately switched by the switches S3 and S5 between the high-side terminal of the capacitor Cb and the line Vss, at the frequency of the sampling signal CK. This configuration corresponds to a switched-capacitor resistor connected in parallel on the capacitor Cb. This parasitic resistance, whose average value decreases when the sampling capacitance Cgs and frequency increase, forms a divider bridge with the resistor R. This decreases the charge voltage of the capacitor Cb, and consequently increases the on-resistance of transistor MN1 at higher switching frequencies.

Figure 6:
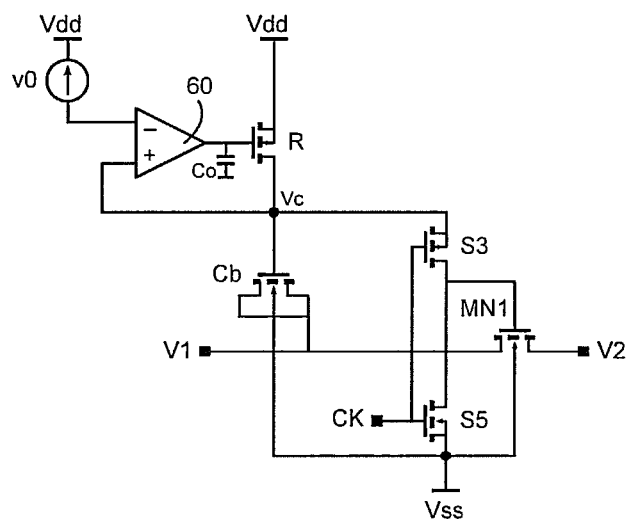
FIG. 6 shows another embodiment of the circuit of FIG. 4, according to the present invention.

FIG. 6 shows an approach that may allow this parasitic effect to be avoided. The resistor R is formed by a P-channel MOS transistor connected in a series regulator configuration. The transistor source is connected to the line Vdd, the drain to the capacitor Cb, and the gate is controlled by a differential amplifier 60. One of the inputs of the amplifier 60 is connected in feedback to the drain of the transistor R, and the other input receives a reference voltage v0 fixed with respect to the line Vdd. This configuration allows the average voltage across the transistor R to be regulated at the value v0. The value v0 is chosen relatively low, since it is subtracted from the useful charge voltage of the capacitor Cb, for example, around 50 mV.

In addition, the frequency response of such a regulator is determined by the capacitive load Co at the output of the amplifier 60, because the amplifier is preferably in the form of a single differential stage whose output supplies current. The value of the capacitance Co, including the gate capacitance of the transistor R, is chosen so that the cutoff frequency of the regulator is lower than the frequency of the signal to be switched V1.

Thus, the regulator is able to impose an average value of the voltage Vc, equal to Vdd−v0, against a variation of the common mode of the input voltage V1 or the presence of the parasitic resistance, mentioned above, generated by the switching of the gate capacitance of transistor MN1. However, the regulator cannot follow the rapid variations of the signal V1, transmitted on the voltage Vc. For these rapid variations, the gate voltage of the transistor R remains constant and the transistor behaves like a resistor.

The substrate of the P-channel MOS transistor R is connected to the line Vdd, so that the threshold voltage of the transistor is kept at a minimum. The transistor R thus has a parasitic diode between the node Vc and the line Vdd, whose cathode is on the side of the line Vdd. The existence of this diode is the reason why an N-channel transistor is chosen conventionally for the transistor S1 in the circuit of FIG. 3. But given the voltage levels used here, this parasitic diode is not an issue. Indeed, given that the voltage Vc may reach $Vc_{max}=V1_{max}V_{cb}=3V$, the forward bias voltage of the parasitic diode reaches $Vc_{max}-Vdd=0.5$ V maximum, which is an insufficient value to turn the diode on. If need be, the forward bias voltage may be reduced by increasing the reference v0 of the series regulator.

In FIG. 6, an exemplary structure of the capacitor Cb is also shown. As previously mentioned, the substrate of the main transistor MN1 is connected to the fixed potential Vss, lower than the minimum value of the source potential V1, of the transistor. It guarantees a minimum threshold voltage of the transistor, and therefore a minimum on-resistance Ron. However, the body-source voltage Vbs of the transistor varies with the voltage V1, causing a modulation of the threshold voltage and the resistance Ron.

To compensate for this phenomenon, which causes a distortion of the signal sampled on a capacitor (not shown) connected to the output terminal V2, the capacitor Cb is formed from a MOS transistor of same nature as the N-channel MOS transistor MN1, and connected likewise. The substrate of the transistor Cb is thus connected to the line Vss. The source and the drain of the transistor Cb, connected together, form the low-side terminal of the capacitor. The high-side terminal of the capacitor is formed by the transistor gate.

With this configuration, the variation of the signal V1 causes, as for transistor MN1, a modulation of the threshold voltage of the transistor Cb, which results in a modulation of the capacitance value. As the charge stored remains constant, the capacitance variation causes a variation of the voltage $V_{cb}$ across the capacitor, which is transmitted between the gate and source of transistor MN1. This modulation of the voltage $V_{cb}$ happens to be produced in the proper way, i.e. the voltage $V_{cb}$ increases when the threshold voltage increases. Thus, when the resistance Ron of transistor MN1 tends to decrease because the threshold voltage increases, the gate-source voltage increases, causing a decrease of the resistance Ron.

A switch structure has been described, in association with an optimum combination of voltage levels and gate oxide thicknesses, making it possible to reach a particularly simple and efficient structure operating under heavy constraints linked to power supply voltages. This structure can a fortiori be used in applications where the constraints set on power supply voltages are low.

Many variations and modifications of the embodiments described here will clearly appear to those skilled in the art. The main switching transistor has been described as an N-channel MOS transistor. A P-channel transistor may be used instead, the other elements of the circuits then being replaced by their complementary elements. It may also be considered to use two complementary switching transistors connected in parallel to process an analog signal of larger range.

That which is claimed is:

1. A switch for an analog signal comprising:
a main metal oxide semiconductor (MOS) transistor comprising a first conduction terminal configured to provide an input terminal, a second conduction terminal configured to provide an output terminal, and a control terminal;
a capacitor comprising a first terminal permanently coupled to said first conduction terminal of said main MOS transistor, and a second terminal;
a circuit configured to charge said capacitor; and
a first auxiliary transistor configured to couple said second terminal of said capacitor to said control terminal of said main MOS transistor in response to a control signal;
said circuit comprising a resistor configured to permanently couple said second terminal of said capacitor to a first reference voltage, said capacitor and said resistor configured to provide a high-pass filter having a cutoff frequency lower than a frequency of the analog signal.

2. The switch of claim 1 wherein said main MOS transistor has a single gate oxide thickness; wherein said first auxiliary transistor has a double gate oxide thickness;
wherein the first reference voltage is compatible with transistors having the double gate oxide thickness; and wherein a common mode voltage of the analog signal is compatible with transistors having the single gate oxide thickness.

3. The switch of claim 1 further comprising a second auxiliary transistor having a double gate oxide thickness configured to couple said control terminal of said main MOS transistor to a second reference voltage in phase opposition with the control signal.

4. The switch of claim 3 wherein said first and second auxiliary transistors comprise complementary MOS transistors configured to provide an inverter powered between the second reference voltage and said second terminal of the capacitor.

5. The switch of claim 3 wherein said capacitor comprises a transistor having a substrate; wherein said main MOS transistor has a substrate; and wherein said substrates of said main MOS transistor and said transistor forming said capacitor are coupled to the second reference voltage.

6. The switch of claim 1 wherein said resistor comprises a series regulator configured to regulate a voltage on said second terminal of said capacitor from the first reference voltage; and wherein said series regulator has a response limited in frequency so that it imposes an average voltage on said second terminal of said capacitor, and behaves like a resistor at the frequency of the analog signal.

7. A switch for an analog signal comprising:
a switch metal oxide semiconductor (MOS) transistor comprising a first conduction terminal configured to provide an input terminal, a second conduction terminal configured to provide an output terminal, and a control terminal;
a capacitor comprising a first terminal coupled to said first conduction terminal of said switch MOS transistor, and a second terminal;
a first transistor configured to couple said second terminal of said capacitor to said control terminal of said switch MOS transistor in response to a control signal; and
a resistor configured to couple said second terminal of said capacitor to a first reference voltage;
said capacitor and said resistor configured to provide a high-pass filter having a cutoff frequency lower than a frequency of the analog signal.

8. The switch of claim 7 wherein said switch MOS transistor has a single gate oxide thickness; wherein said first transistor has a double gate oxide thickness; wherein the first reference voltage is compatible with transistors having the double gate oxide thickness; and wherein a common mode voltage of the analog signal is compatible with transistors having the single gate oxide thickness.

9. The switch of claim 7 further comprising a second transistor having a double gate oxide thickness configured to couple said control terminal of said switch MOS transistor to a second reference voltage in phase opposition with the control signal.

10. The switch of claim 9 wherein said first and second transistors comprise complementary metal oxide semiconductor (MOS) transistors configured to provide an inverter powered between the second reference voltage and said second terminal of the capacitor.

11. The switch of claim 9 wherein said capacitor comprises a transistor having a substrate; wherein said switch MOS transistor has a substrate; and wherein said substrates of said switch MOS transistor and said transistor forming said capacitor are coupled to the second reference voltage.

12. A method for making a switch for an analog signal comprising:
providing a switch metal oxide semiconductor (MOS) transistor comprising a first conduction terminal to provide an input terminal, a second conduction terminal to provide an output terminal, and a control terminal;
coupling a first terminal of a capacitor to the first conduction terminal of the switch MOS transistor;
providing a first transistor to couple a second terminal of the capacitor to the control terminal of the switch MOS transistor in response to a control signal;
providing a resistor to couple the second terminal of the capacitor to a first reference voltage; and
using the capacitor and the resistor to provide a high-pass filter having a cutoff frequency lower than a frequency of the analog signal.

13. The method of claim 12 wherein the switch MOS transistor has a single gate oxide thickness; wherein the first transistor has a double gate oxide thickness; wherein the first reference voltage is compatible with transistors having the double gate oxide thickness; and wherein a common mode voltage of the analog signal is compatible with transistors having the single gate oxide thickness.

14. The method of claim 12 further comprising coupling a second transistor having a double gate oxide thickness to couple the control terminal of the switch MOS transistor to a second reference voltage in phase opposition with the control signal.

15. The method of claim 14 wherein the first and second transistors comprise complementary metal oxide semiconductor (MOS) transistors to provide an inverter powered between the second reference voltage and the second terminal of the capacitor.

16. The method of claim 14 wherein the capacitor comprises a transistor having a substrate; wherein the switch MOS transistor has a substrate; and further comprising coupling the substrates of the switch MOS transistor and the transistor forming the capacitor to the second reference voltage.

17. The method of claim 12 wherein the resistor comprises a series regulator to regulate a voltage on the second terminal of the capacitor from the first reference voltage; and wherein the series regulator has a response limited in frequency so that it imposes an average voltage on the second terminal of the capacitor, and behaves like a resistor at the frequency of the analog signal.

\* \* \* \* \*